United States Patent [19]
Georgescu et al.

[11] Patent Number: 5,793,079
[45] Date of Patent: Aug. 11, 1998

[54] SINGLE TRANSISTOR NON-VOLATILE ELECTRICALLY ALTERABLE SEMICONDUCTOR MEMORY DEVICE

[75] Inventors: Sorin Georgescu; Andrei Mihnea, both of San Jose; Radu Vanco, Monte Sereno, all of Calif.

[73] Assignee: Catalyst Semiconductor, Inc., Sunnyvale, Calif.

[21] Appl. No.: 681,444

[22] Filed: Jul. 22, 1996

[51] Int. Cl.$^6$ ................................. H01K 27/788
[52] U.S. Cl. .................. 257/316; 257/315; 257/320; 257/321; 257/324
[58] Field of Search ..................... 257/316, 317, 257/318, 319, 321, 324, 320, 315

[56] References Cited

U.S. PATENT DOCUMENTS

| | | | |
|---|---|---|---|
| 4,099,196 | 7/1978 | Simko | 257/317 |
| 5,053,841 | 10/1991 | Miyakawa et al. | 257/318 |
| 5,067,108 | 11/1991 | Jeng | 365/185 |
| 5,126,809 | 6/1992 | Hirai | 257/316 |
| 5,284,784 | 2/1994 | Manley | 257/319 |
| 5,315,541 | 5/1994 | Harari et al. | |
| 5,338,952 | 8/1994 | Yamauchi | 257/319 |
| 5,394,360 | 2/1995 | Fukumoto | 257/318 |
| 5,455,792 | 10/1995 | Yi | 257/319 |
| 5,614,747 | 3/1997 | Ahn et al. | 257/321 |

OTHER PUBLICATIONS

Bergemont et al., "NOR Virtual Ground (NVG)–A New Scaling Concept for Very High Density Flash EEPROM and its Implementation in a 0.5um Process", IEEE, 1993.

Kazerounian et al., "Alternate Metal Virtual Ground EPROM Array Implemented in a 0.8μm Process for Very High Density Applications". IEEE, 1991.

Krause, Reinhardt., "Basic Flash–Silicon Storage Tech Tunes Out Hype In The Memory Market" Investor's Business Daily, May 20, 1996.

Lee et al., "An 18 Mb Serial Flash EEPROM fom Solid–State Disk Applications," Symposium on VLSI Circuits Digest of Technical Papers, IEEE, 1994.

Ma, Yale et al., "A Dual-Bit Split Gate EEPROM (DSG) Cell in Contactless Array for Single-Vcc High Density Flash Memories", IEEE, 1994.

(List continued on next page.)

*Primary Examiner*—Carl W. Whitehead
*Attorney, Agent, or Firm*—Beyer & Weaver, LLP

[57] ABSTRACT

An electrically alterable semiconductor memory device having an array of memory cells formed by individual transistors. The structure of the memory cells is compact and facilitates high density memory devices and is particularly well suited for contactless, virtual ground arrays. The memory cells can be read and programmed a page at a time. The memory cells can also be programmed using source-side hot-electron injection with improved efficiency and lowered programming currents. In one embodiment, the structure of the memory cells include: a substrate having a diffused source region, a diffused drain region, and a channel region between the diffused source region and the diffused drain region; a select gate positioned adjacent to the channel region, the select gate being positioned over a first portion of the channel region, the first portion being adjacent to the diffused source region and extending therefrom towards the diffused drain region; a floating gate adjacent to the channel region, the floating gate being positioned over a second portion of the channel region, the second portion being adjacent to the diffused drain region and extending therefrom towards the diffused source region; and a control gate over the floating gate. By providing select gates in the memory cells, problematic reverse currents in adjacent unselected memory cells of a contactless, virtual ground array are blocked or prevented during programming. The invention also pertains to a method for fabricating the semiconductor memory device.

31 Claims, 11 Drawing Sheets

OTHER PUBLICATIONS

Mehrotra et al., "Serial 9Mb Flash EEPROM for Solid State Disk Applications" Symposium on VLSI Circuits Digest of Technical Papers, 1992.

Van Houdt, et al., "A 25ns/Byte–Programmable Low–Power SSI Flash Array With a New Low–Voltage Erase Scheme for Embedded Memory Applications." 14th Nonvolatile Semiconductor Memory Workshop, IEEE, 1995.

Van Houdt, et al., "HIMOS—A High Efficiency Flash $E^2$–PROM Cell for Embedded Memory Applications." IEEE Transactions on Electron Devices, vol. 40, No. 12, Dec. 1993.

Woo et al., "A Novel Memory Cell Using Flash Array Contactless EPROM (FACE) Technology" IEEE, 1990.

"SuperFlash EEPROM Technology".Silicon Storage Technology, Inc., 1994.

5,793,079

1

SINGLE TRANSISTOR NON-VOLATILE ELECTRICALLY ALTERABLE SEMICONDUCTOR MEMORY DEVICE

BACKGROUND OF THE INVENTION

1. Field of the Invention

The present invention relates to semiconductor memory devices, and more particularly, to electrically alterable semiconductor memory devices.

2. Description of the Related Art

Electronically alterable semiconductor memory devices include, for example, Electrically Erasable Programmable Read-Only Memory (EEPROM) devices and FLASH memory. The electronically alterable semiconductor memory devices operate like Read-Only Memory (ROM) in that they provide non-volatile storage of digital data but offer the advantage of being electrically programmable.

Manufacturers of electrically alterable semiconductor memory devices continually strive to increase density and speed. Density of memory cells in semiconductor devices is very important in the competitive semiconductor memory industry. Operational speeds (e.g., access time, program time) are also important for semiconductor memory devices. Hence, there is also a desire to provide memory devices offering greater density and faster speed.

With electronically alterable semiconductor memory devices there are also several specific problems that exist with respect to reprogramming. Currently, electronically alterable semiconductor memory devices use either Fowler-Nordheim tunneling or hot-electron injection. Conventionally, when programming the memory cells, high currents are required if programming is done by hot-electron injection, while low current but high voltages (e.g., 20 Volts) are required for Fowler-Nordheim tunneling. This requirement for high currents/voltage impacts the density and reliability of the memory devices and is particularly problematic for portable applications. Examples of portable applications include computers, cellular phones, and the like.

Thus, there is a need for non-volatile electrically alterable semiconductor memory devices that facilitate high densities and lowered programming currents and voltages.

SUMMARY OF THE INVENTION

Broadly speaking, the invention is an electrically alterable semiconductor memory device with a compact cell structure that facilitates high density memory devices and is able to be programmed using source-side hot-electron injection with improved efficiency and lowered programming currents and voltages. The invention also includes a method for fabricating the semiconductor memory device.

The invention can be implemented in numerous ways, including as an apparatus, device or method. Several embodiment of the invention are described below.

As a programmable and erasable non-volatile memory device having a plurality of memory cells, an embodiment of the invention includes: a substrate having the memory cells formed thereon, the substrate having diffused source/drain regions parallel to one another in a first direction, and forming channel regions between adjacent pairs of the diffused source region and the diffused drain region; select gate traces positioned over each of the channel regions, the select gate traces being parallel to one another in the first direction, each of the select gate traces being positioned over a first portion of the corresponding channel region, the first

2 portion of the corresponding channel region being adjacent to the corresponding diffused source region and extending therefrom towards the corresponding diffused drain region; floating gates for the memory cells, each of the memory cells including one of the floating gates, each of the floating gates being positioned over a second portion of the corresponding channel region, the second portion of the corresponding channel region being adjacent to the corresponding diffused drain region and extending therefrom towards the diffused source region; and wordline traces over each of the floating gates, each of the wordline traces being parallel to one another in a second direction, and each of the wordline traces being positioned over the corresponding floating gates in the second direction. a programmable and erasable memory device having a plurality of memory cells formed by individual transistors, according to an embodiment of the invention each of the memory cells include: a substrate having a diffused source region, a diffused drain region, and a channel region between the diffused source region and the diffused drain region; a select gate positioned adjacent to the channel region, the select gate being positioned over a first portion of the channel region, the first portion being adjacent to the diffused source region and extending therefrom towards the diffused drain region; a floating gate adjacent to the channel region, the floating gate being positioned over a second portion of the channel region, the second portion being adjacent to the diffused drain region and extending therefrom towards the diffused source region; and a control gate over the floating gate.

As a semiconductor memory device, an embodiment of the invention includes: a plurality of memory blocks, each of the memory blocks a plurality of memory cells, having first and second parity select lines, main bitlines and wordlines, each of the memory cells having diffused source/drain regions that connect to bitlines; a row address decoder for activating at least one of the wordlines; main bitlines that can be coupled to the bitlines of the memory blocks; and a block selector operable to select at least one of the memory blocks and to couple the main bitlines to the bitlines of the at least one of the selected memory blocks.

As a method for fabricating a semiconductor memory device on a semiconductor substrate, the semiconductor memory device having a plurality of single-transistor memory cells, an embodiment of the invention includes the operations of: providing a semiconductor substrate of a first impurity type; forming a first dielectric layer over the semiconductor substrate; depositing a first conductive material layer over the first dielectric layer; patterning the first conductive material layer to form select lines and removing the portion of the first dielectric layer not being covered by conductive material; forming a second dielectric layer over the portion of the semiconductor substrate being exposed after the patterning and removing of the first conductive material and over the select lines; depositing a second conductive material layer over the second dielectric layer; patterning the second conductive material layer to form floating lines; forming drain and source regions by implanting impurities of a second impurity type; forming a third dielectric layer over the second conductive material layer as well as portions of the second dielectric layer and/or the semiconductor substrate being exposed after the patterning of the second conductive material layer; depositing a third conductive material layer over the third dielectric layer; patterning the third conductive material layer to form wordlines; and patterning the second conductive material layer, concurrently with the patterning of the third conductive material layer, to form floating gates from the floating gate lines. Additional operations may be performed, such as, depositing a supplemental polysilicon layer over the first polysilicon layer and the first dielectric layer, and patterning the supplemental polysilicon layer to form spacers adjacent and electrically coupled to the select lines. The second dielectric layer can be formed in multiple operations so as to have different thickness regions.

The advantages to the invention are numerous. One advantage of the invention is that the memory cell size is compact and dense and well suited for contactless, virtual ground arrays. Another advantage of the invention is that programming is performed with lower currents because source-side hot-electron injection is achieved with improved efficiency. Yet another advantage of the invention is that problematic reverse currents in adjacent unselected memory cells of a contactless, virtual ground array are blocked or prevented by the select gates of the memory cells.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The invention pertains to an electrically alterable semiconductor memory device. The programmable and erasable memory device according to the invention has an array of memory cells formed by individual transistors. In one embodiment, the structure of the memory cells include: a substrate having a diffused source region, a diffused drain region, and a channel region between the diffused source region and the diffused drain region; a select gate positioned adjacent to the channel region, the select gate being positioned over a first portion of the channel region, the first portion being adjacent to the diffused source region and extending therefrom towards the diffused drain region; a floating gate adjacent to the channel region, the floating gate being positioned over a second portion of the channel region, the second portion being adjacent to the diffused drain region and extending therefrom towards the diffused source region; and a control gate over the floating gate.

The structure of the memory cells is a compact cell structure that facilitates high density memory devices and is particularly well suited for contactless, virtual ground arrays. The memory cells can also be read and programmed a page at a time. The memory cells can also be programmed using source-side hot-electron injection with efficiency and lowered programming currents. By providing select gates in the memory cells, problematic reverse currents in adjacent unselected memory cells of a contactless, virtual ground array are blocked or prevented. The invention also pertains to a method for fabricating the semiconductor memory device.

Embodiments of the invention are discussed below with reference to FIGS. 1–8. However, those skilled in the art will readily appreciate that the detailed description given herein with respect to these figures is for explanatory purposes as the invention extends beyond these limited embodiments.

Figure 1:
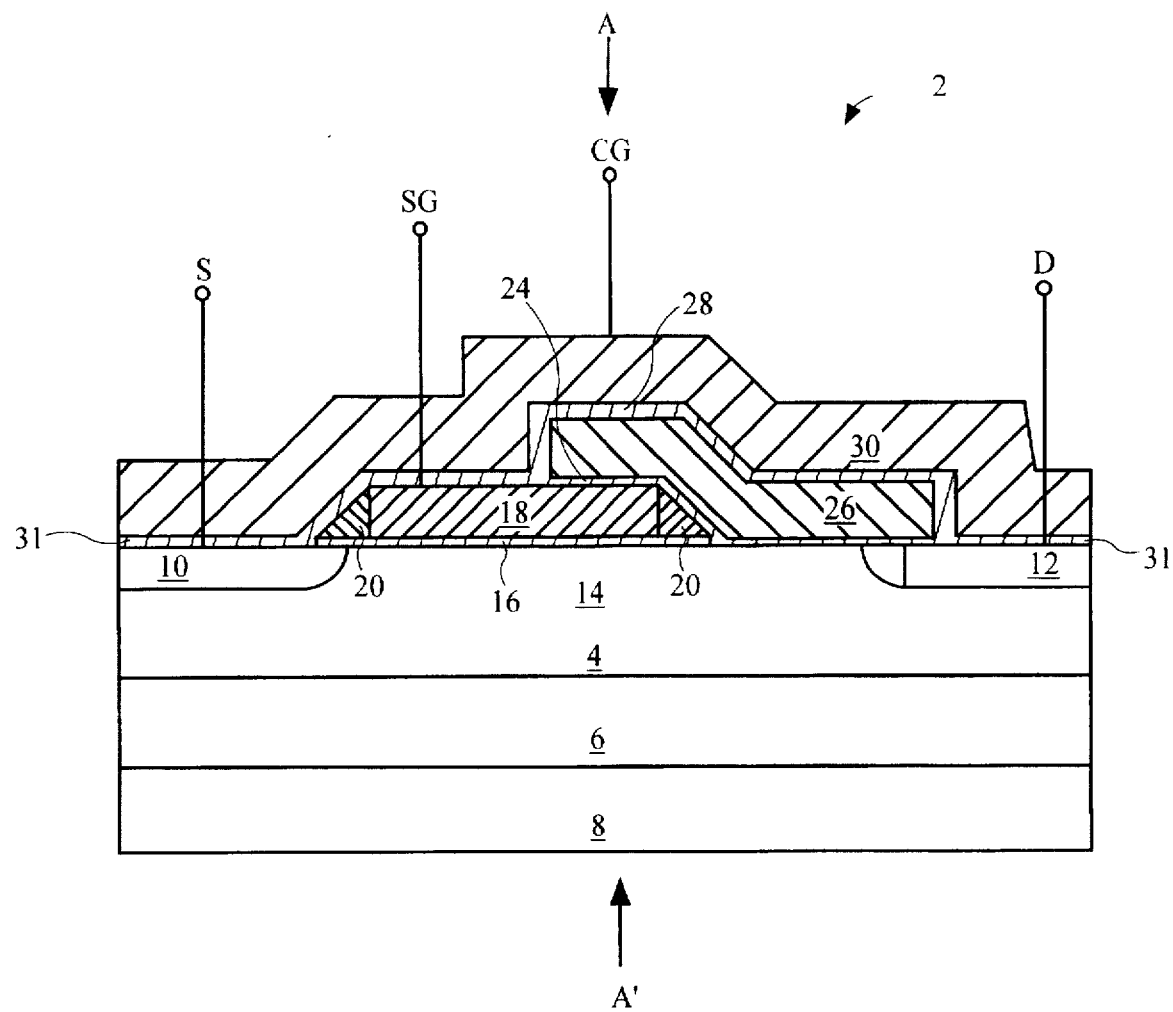
FIG. 1 is a diagram of a cross-section of a memory cell for a semiconductor memory device according to an embodiment of the invention.

FIG. 1 is a diagram of a cross-section of a memory cell 2 for a semiconductor memory device according to an embodiment of the invention. The memory cell is a single transistor semiconductor structure.

The memory cell 2 is fabricated on a semiconductor substrate 4. The semiconductor substrate 4 is formed in a well 6, and the well 6 is in turn formed on a main substrate 8. The impurity type of the semiconductor substrate 4 and the main substrate 8 are the same and opposite the impurity type of the well 6. A source region 10 and a drain region 12 are implanted and diffused into the semiconductor substrate 4. A channel region 14 is formed at the upper surface of the semiconductor substrate 4 between the source region 10 and the drain region 12.

A select gate 18 is formed over a first portion of the channel region 14. The first portion of the channel region 14 is the portion of the channel region 14 that is adjacent the source region 10 and which extends therefrom towards the drain region 12. In one embodiment, the select gate 18 is formed from doped polysilicon. The doping of the polysilicon is done to make the polysilicon conductive. A dielectric 16 is formed underneath the select gate 18. In other words, the dielectric 16 is positioned between the select gate 18 and the upper surface of the semiconductor substrate 4.

Preferably, the select gate 18 has spacers 20 formed along an opposite pair of sides of the select gate 18. The spacers 20 are physically adjacent and electrically coupled to the select gate 18. The spacers 20 are preferably formed by doped polysilicon. The spacers 20 are provided to prevent stringer formation during manufacture of the semiconductor memory devices. However, the spacers 20 are optional with other manufacturing processes.

A floating gate 26 is formed over a second portion of the channel region 14. The second portion of the channel region 14 is the portion of the channel region 14 that is adjacent the drain region 12 and which extends therefrom towards the source region 10. In one embodiment, the floating gate 26 is formed from doped polysilicon. A dielectric 22 is positioned between the floating gate 26 and the semiconductor substrate 4.

Preferably, as illustrated in FIG. 1, the floating gate 26 also extends over (i.e., overlaps) a portion of the select gate 18 nearest the drain region 12. A dielectric 24 is positioned between the select gate 18 and the floating gate 26.

A control gate 30 is formed over the floating gate 26. In one embodiment, the control gate 30 is formed from doped polysilicon. A dielectric 28 is positioned between the control gate 30 and the floating gate 26. A dielectric 31 is also positioned between the control gate 30 and the drain and source regions 10 and 12.

In one embodiment, the dielectric layers are oxides. For example, $SiO_2$ can be used for the dielectrics 16 and 31, and a sandwich of $SiO_2$/nitride/$SiO_2$ (ONO) can be used for the dielectric 28. Further, although polysilicon is preferred for the formation of the various gates of the memory cell 2, the polysilicon can be replaced with other conductive materials such as metal silicide or metal.

With semiconductor memory devices of this type there are three basic modes of operation, namely, read mode, program mode and erase mode. In the read mode, data stored in the memory cells 2 is read. In the program mode, data is stored in the memory cells 2. The program mode is analogous to a write operation in random-access memory (RAM) devices, except that the programming typically takes a longer time (than would a write operation), but once programmed is non-volatile. In such an arrangement, according to the invention, each of the memory cells 2 is a storage site and requires five signals to control its operation. The required signals are a source signal, a drain signal, a select signal, a control signal, and a well signal.

Given that the memory cell 2 is intended for used in a semiconductor memory device, the memory cells 2 will be densely arranged in an array fashion having rows and columns as is well known in the art. In one embodiment, the semiconductor memory cells 2 are fabricated adjacent to one another on the semiconductor substrate 4 so as to form an array of memory cells 2. With the memory cells 2 fabricated adjacent to one another, the adjacent memory cells 2 will share the source and drain regions 10 and 12. For example, the source region 10 of one memory cell 2 is the drain region 12 for the adjacent memory cell 2. In such an embodiment, only one of the adjacent memory cells 2 can by activated at a time as discussed in more detail below. This is known as a virtual ground architecture.

According to an embodiment of the invention having such an array arrangement, the select gates 18 are conductive traces that extend along the direction of the column, the source and drain regions 10 and 12 are conductive traces that extend along the column, the control gates 30 are conductive traces that extend along the row. Preferably, the direction of the rows is perpendicular to the direction of the columns. In one embodiment, the conductive traces formed by the source and drain regions 10 and 12 receive source and drain signals from bitlines associated with the semiconductor memory device, and the conductive traces formed by the control gates 30 are associated with wordlines associated with the semiconductor memory device.

With such an array arrangement, the memory cells 2 are preferably formed in an array structure and various lines, traces or gates are coupled together such that the array is contactless. In a contactless array architecture, the memory cells 2 do not directly connect to the metal bitlines of the semiconductor memory device. Instead, memory cells are coupled to the diffused bitlines in a fashion such that each of the diffused bitlines alternatively acts as source and drain for adjacent memory cells.. The contactless array architecture is advantageous because it allows for smaller memory cells and therefore greater densities which is of primary concern in the semiconductor memory industry.

Figure 2:
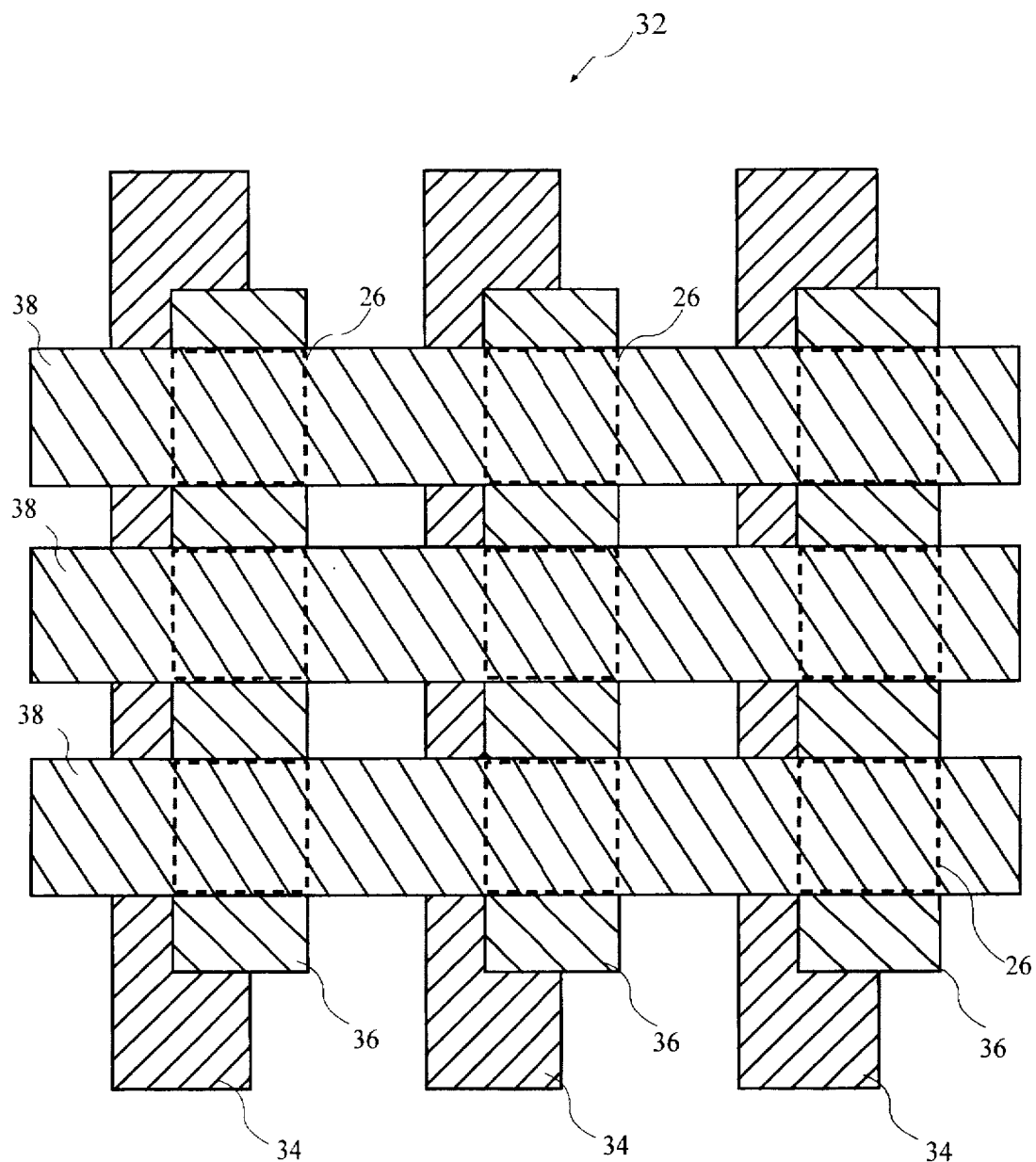
FIG. 2 is a partial top view of a representative semiconductor memory device having a contactless array architecture according to an embodiment of the invention.

FIG. 2 is a partial top view of a representative semiconductor memory device 32 having a contactless array architecture according to an embodiment of the invention. In particular, FIG. 2 illustrates the direction and layout of various conductive traces of the semiconductor device 32. The rows and columns of the conductive traces of the semiconductor device 32 intersect at each of the memory cells 2 so that each memory cell 2 can be individually selected. The conductive traces for the select gates 18 of the memory cells 2 are formed by select gate traces 34. These select gate traces 34 extend in a column direction with respect to the semiconductor memory device. For example, in FIG. 2, the column direction is direction indicated by the arrow A. Hence, in FIG. 2, there are three columns, each having one of the select gate traces. Also, the formation of conductive traces for the floating gates 26 of the memory cells 2 are formed by floating gate traces 36. These floating gate traces 36 also extend in the column direction. In the case of the preferred layout in which the floating gates 26 partially overlay the corresponding select gates 18, the floating gate traces 36 are formed partially overlapped with the select gate traces 34 as shown in FIG. 2. After the fabrication of the memory cells 2 is completed, the floating gate traces 36 are partially etched away (unlike that shown in FIG. 2) so as to form the floating gates 26 that are isolated from one another and surrounded by dielectric so that their potential "floats". In addition, the conductive traces for the wordlines (e.g., control gates) 30 are formed by wordline traces 38. The wordline traces 38 extend in a row direction with respect to the semiconductor memory device and intersect with each of the columns. For example, in FIG. 2, the row direction is the direction indicated by the arrow B. As illustrated in FIG. 2, the floating gates 26 are formed at the intersection of the floating gate traces 36 and the wordline traces 38.

With the contactless array architecture, the semiconductor memory device typically is designed to include a plurality of blocks of the memory cells. A block select line is used to select one of the blocks. The conductive traces for the source and drain regions 10 and 12 of the selected block are coupled to the bitlines of the semiconductor memory device. Then a row select signal is used to select one of the wordlines to the semiconductor memory device. A parity select signal then activates odd or even ones of the memory cells along the selected wordline and deactivates the memory cells of the opposite parity along the selected wordline. In other words, alternative ones of the memory cells are activated along the selected wordline. At this point, the data stored in the activated memory cells can be read or new data can be programmed into the activated memory cells.

Reading the data stored in a memory cell 2 is done by connecting the source region 10 (or drain region 12) to ground, connecting the drain region 12 (or source region 10) to a voltage of about 1 to 1.5 volts, connecting the select gate 18 to about 2.5 to 5 volts and the control gate 30 to about 2.5 to 5 volts, and sensing the electrical conduction through the memory cell 2. Up to one half of all the memory cells 2 on a row can be simultaneously read by activating a first parity select line, while a second parity select line is grounded to thereby suppress the conduction current in a reverse direction for the other half (deactivated) of the memory cells 2. of memory cells 2 is achieved a block at a time. The technique used to achieve erasure is Fowler-Nordheim tunneling. The erasure mode is entered when a zero (or negative voltage) is applied on all pertinent wordlines and a zero (or negative) voltage is applied on the well 4 for the block. If a positive voltage is being applied to the well 4 for the block, then the same voltage should be applied to the well 6 to avoid forward biasing the well junction.

Programming of the memory cells 2 is achieved by source-side hot-electron injection by applying 3 to 6 volts on the drain region 12, 10 to 13 volts on the control gate 30, 1 to 3 volts on the select gate 18 and grounding the source region 10. Up to one half of all the memory cells 2 on the same row can be programmed simultaneously in about 10 to 50 μs. The programming for the memory cells 2 can be done with a single external voltage source that may be as low as 1.8 Volts, provided on-chip voltage multiplication is provided. Again, during programming, one parity select signal is activated while the other parity select signal is grounded to suppress the flow of electrical current through the unselected memory cells 2 on the selected row.

Due to the virtual ground organization, programming of all memory cells 2 in a row to a given pattern is done in two steps. In the first step, the memory cells 2 of all even-numbered columns are programmed simultaneously. Then, in the second step, the memory cells 2 in all odd-numbered columns are programmed simultaneously. Therefore, each half-row of memory cells 2 in columns of the same parity (even or odd) represents a page. All the select gate traces 34 pertaining to columns of the same parity (page) are tied together and coupled to one of the parity select signals. When a page is written, one of the parity select signals is raised to 0.5–3.0 Volts, while the other of the parity select signals is grounded to prevent the flow of current in the reverse direction through the memory cells 2 of the unselected parity (page).

To operate the semiconductor memory device in the read mode, the program mode or the erase mode, there are recommended voltage levels for the various connections to the memory cell 2. The recommended voltage levels for these three basic memory modes are summarized in Table I below.

in which the drain and source regions serve as contacts, programming has also been problematic because reverse currents tend to flow through the adjacent unselected memory cells of the selected wordline. These reverse currents are undesirable because they can damage the data being stored in the adjacent unselected memory cells. In accordance with the invention, these reverse currents are blocked or prevented by the select gates 18 of the memory cells. Namely, for an adjacent pair of memory cells, one of the memory cells is activated by a parity select line and the other memory cell is deactivated by another parity select line. The activated memory cell has its select gate activated so that source-side hot-electron injection can take place. The deactivated memory cell has its select gate deactivated so that the channel region is blocked, thereby preventing any current flow through the deactivated memory cell.

Figure 6:
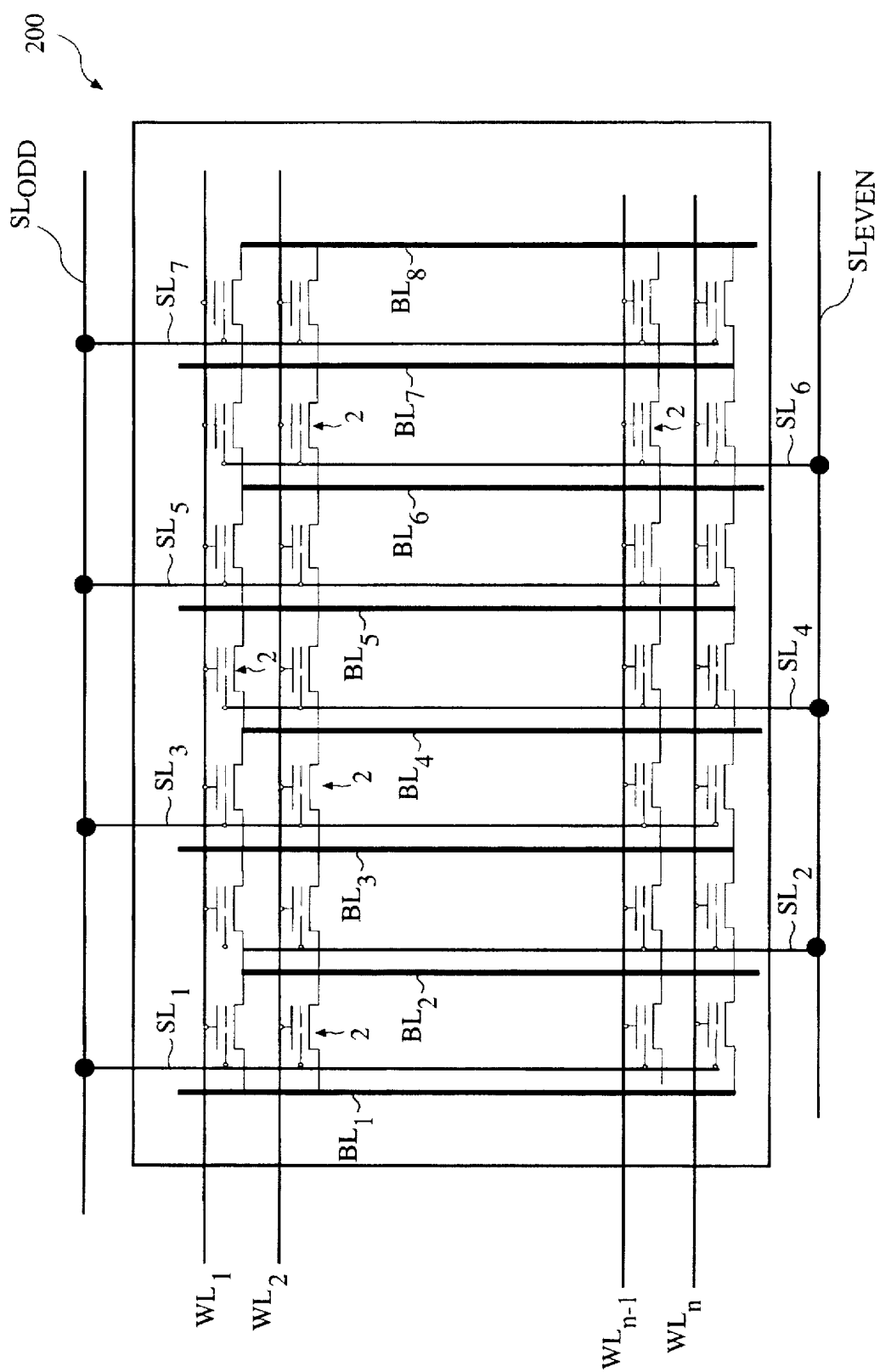
FIG. 6 is a schematic diagram of a memory block according to an embodiment of the invention.

FIG. 6 is a schematic diagram of a memory block 200 according to an embodiment of the invention. The memory block 200 includes a plurality of memory cells 2. The structure for the memory cells 2 was described above with reference to FIG. 1. The diffused source and drain regions 10 and 12 of the memory cells for the diffused bitlines $BL_1$ through $BL_8$ which extend in a vertical direction. The memory block 200 receives wordlines $WL_1$ through $Wl_n$, an odd select line $SL_{ODD}$ and an even select line $SL_{EVEN}$. The wordlines $WL_1$ through $Wl_n$ extend in a horizontal direction and define rows. Along each row in the memory clock 200, the respective wordline connects to the control gates 30 of the memory cells 2 along the given row. The odd select line $SL_{ODD}$ (parity select line) interconnects the odd select lines $SL_1$, $SL_3$, $SL_5$ and $SL_7$. The even select line $SL_{EVEN}$ (parity select line) interconnects the even select lines $SL_2$, $SL_4$, and $SL_6$. All of the odd and even select lines $SL_1$, –$SL_6$ extend in the vertical direction, and each select line serves to connect to the select gates 18 of the memory cells 2 along

TABLE I

| | | Read | | Program | | Erase |
|---|---|---|---|---|---|---|
| | | Byte | Page | Byte | Page | Block |
| Source Bitline | selected | 0 | 0 | 0 | 0 | 5.0–17.0 V |
| | unselected left | 0 or floating | 1.0 V | 0 or floating | 3.0–6.0 V | 5.0–17.0 V |
| | unselected right | 0 or floating | 1.0 V | 0 or floating | 3.0–6.0 V | 5.0–17.0 V |
| Drain Bitline | selected | 1.0 V | 1.0 V | 3.0–6.0 V | 3.0–6.0 V | 5.0–17.0 V |
| | unselected left | 0 or floating | 0 | 0 or floating | 0 | 5.0–17.0 V |
| | unselected right | 0 or floating | 0 | 0 or floating | 0 | 5.0–17.0 V |
| Select Line | selected | 1.8–5.0 V | 1.8–5.0 V | 0.5–3.0 V | 0.5–3.0 V | –10.0–0 V |
| | unselected | 0 | 0 | 0 | 0 | –10.0–0 V |
| Wordline | selected | 2.0–5.0 V | 2.0–5.0 V | 10.0–13.0 V | 10.0–13.0 V | –10.0–0 V |
| | unselected | 0 | 0 | 0 | 0 | 0 |
| P-well | selected | 0 | 0 | 0 | 0 | 5.0–17.0V |
| (block well) | unselected | 0 | 0 | 0 | 0 | 0 |

To program the memory cells 2, source-side hot-electron injection is used. Although this approach has been previously used with conventional EEPROM or FLASH structures, the memory cell 2 according to the invention offers significant improvements. One major improvement is that the memory cell 2 according to the invention achieves the program efficiency inherent to source-side injection in a smaller area cell. Because of this significant increase in the efficiency of the source-side hot-electron injection, the memory cells 2 can be programmed with significantly lower currents than conventional drain-side injection devices, and in shorter times than other source side injection approaches.

Another important improvement provided by the invention is that in the commonly used virtual ground architecture a given column in the memory block 200. Hence, the memory block 200 offers a virtual ground architecture in which the required cell area is small and in which programming can be done efficiently.

Figure 7:
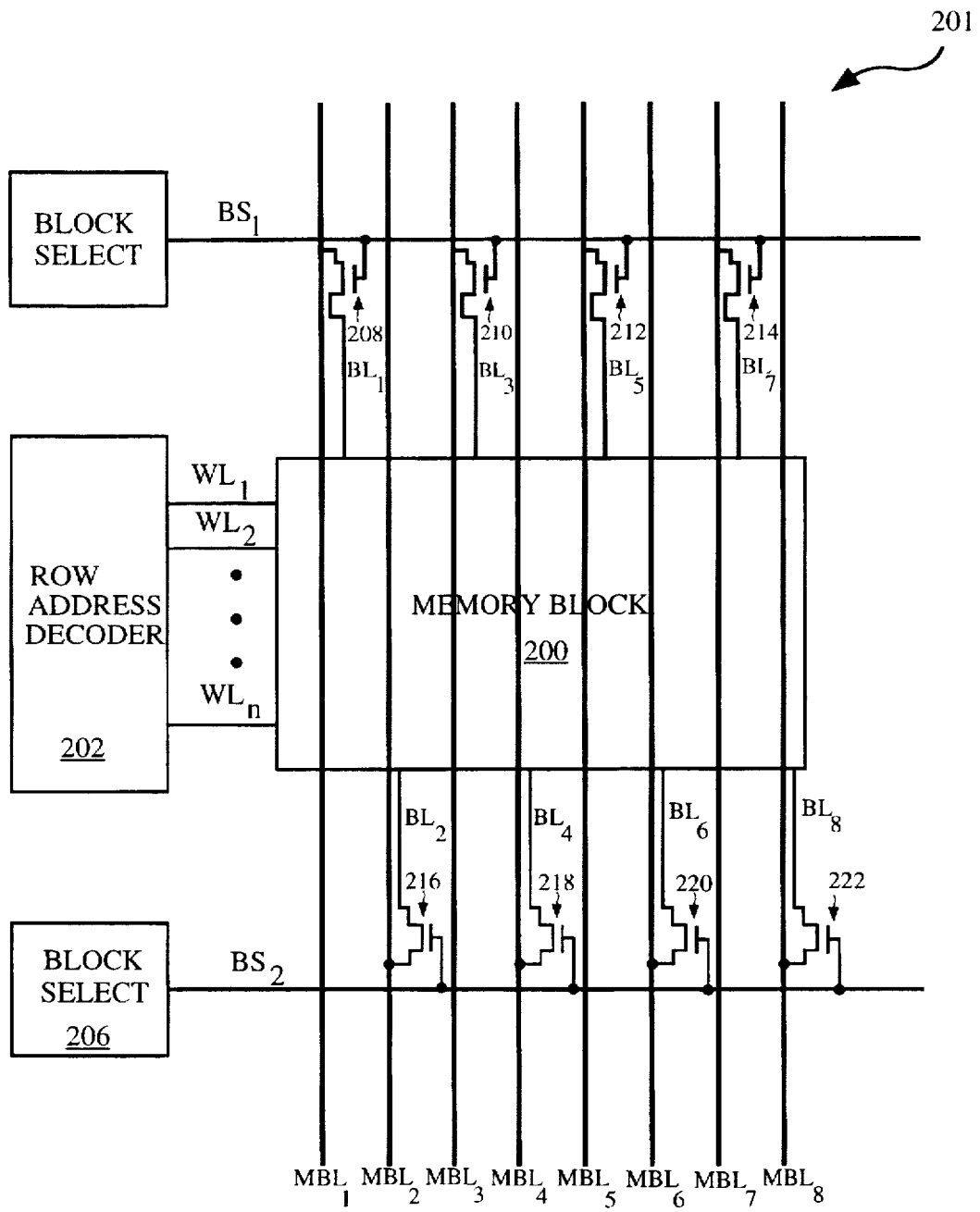
FIG. 7 is a diagram of a block selection arrangement according to an embodiment of the invention.

In one embodiment, a semiconductor memory device includes several of the memory blocks 200. FIG. 7 is a diagram of a block selection arrangement 201 according to an embodiment of the invention. In such an embodiment, besides the memory blocks 200 and the parity select lines (see FIG. 6), the semiconductor memory device includes a row address decoder 202 and block select circuits 204 and 206. The row address decoder 202 operates to activate the appropriate one or more of the wordlines $WL_1$ through $Wl_n$. The block select circuits 204 and 206 operate to select the appropriate one or more of the memory blocks 200. The block select circuit 204 issues a first block select signal $BS_1$ that is supplied to the gate of transistors 208, 210, 212 and 214. When the first block select signal $BS_1$ is activated, the transistors 208, 210, 212 and 214 respectively couple the bitlines $BL_1$, $BL_3$, $BL_5$ and $BL_7$ to main bitlines $MBL_1$, $MBL_3$, $MBL_5$ and $MBL_7$ which serve the entire semiconductor memory device. The block select circuit 206 issues a second block select signal $BS_2$ that is supplied to the gate of transistors 216, 218, 220 and 220. When the second block select signal $BS_2$ is activated, the transistors 216, 218, 220 and 222 respectively couple the bitlines $BL_2$, $BL_4$, $BL_6$ and $BL_8$ to main bitlines $MBL_2$, $MBL_4$, $MBL_6$ and $MBL_8$ which serve the entire semiconductor memory device. Thus, a particular one of the memory blocks of the semiconductor memory device can be selected, and up to half of all the memory cells along the selected row can be simultaneously read or programmed.

Figure 8:
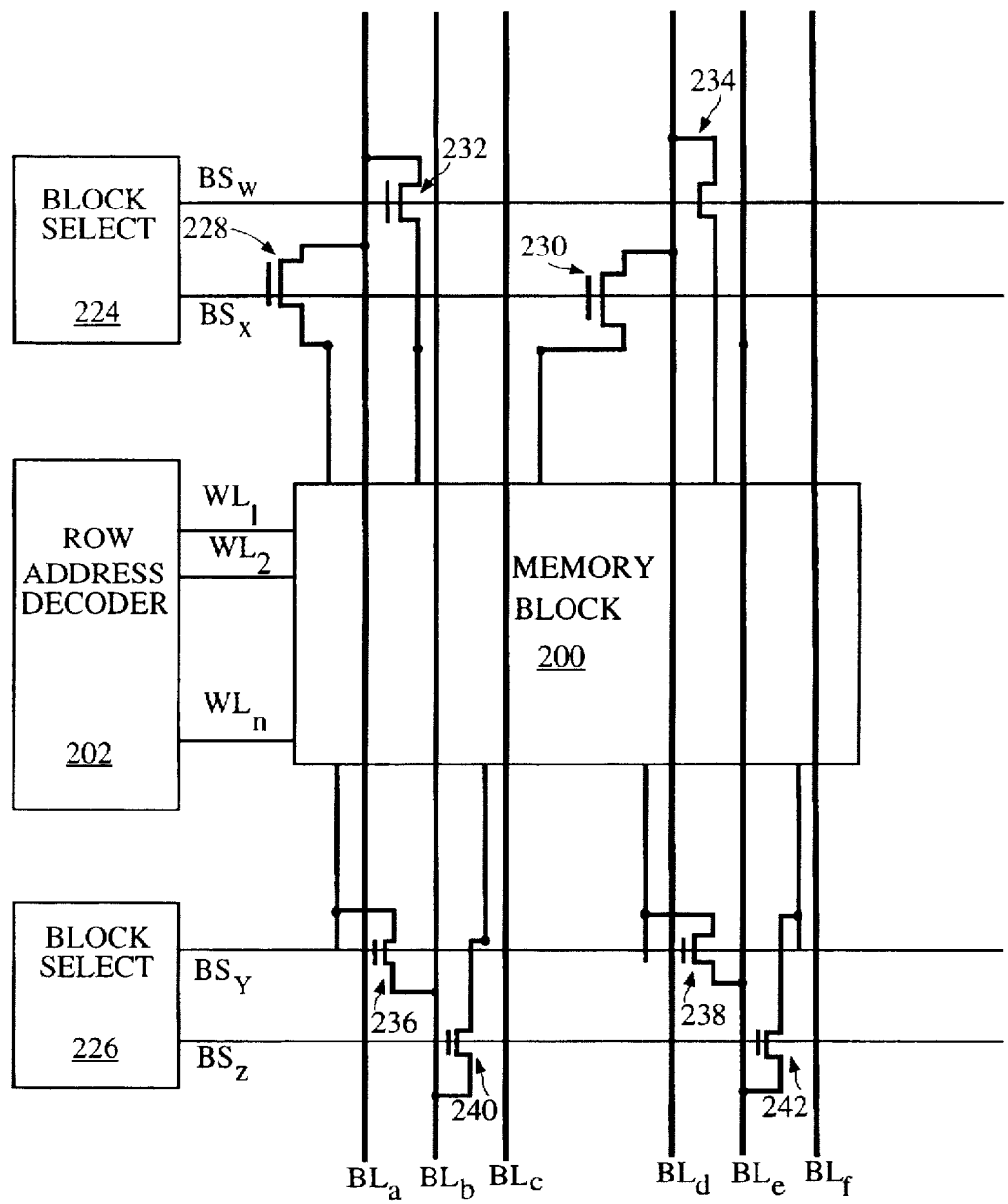
FIG. 8 is a diagram of a block selection arrangement according to another embodiment of the invention.

FIG. 8 is a diagram of a block selection arrangement 223 according to another embodiment of the invention. The block selection arrangement 223 is similar to the block selection arrangement 201 illustrated in FIG. 7, but requires fewer main bitlines. The semiconductor memory device includes not only the memory blocks 200, the parity select lines (see FIG. 6) and the row address decoder 202, but also block select circuits 224 and 226. The row address decoder 202 operates to activate the appropriate one or more of the wordlines $WL_1$ through $Wl_n$. The block select circuits 204 and 206 operate to select the appropriate one or more of the memory blocks 200. The block select circuit 224 issues either a first block select signal $BS_w$ to the gate of transistors 232 and 234 or a second block select signal $BS_x$ to the gate of transistors 228 and 230. When the first block select signal $BS_w$ is activated, the transistors 232 and 234 respectively couple the bitlines $BL_3$ and $BL_7$ to main bitlines $MBL_a$ and $MBL_d$ which serve the entire semiconductor memory device. On the other hand, when the second block select signal $BS_x$ is activated, the transistors 228 and 230 respectively couple the bitlines $BL_1$ and $BL_5$ to the main bitlines $MBL_a$ and $MBL_d$ which serve the entire semiconductor memory device. The block select circuit 226 also produces first and second block select signals $BS_y$ and $BS_z$. When the first block select signal $BS_y$ is activated, the transistors 236 and 238 respectively couple the bitlines $BL_2$ and $BL_6$ to main bitlines $MBL_b$ and $MBL_e$ which serve the entire semiconductor memory device. On the other hand, when the second block select signal $BS_z$ is activated, the transistors 240 and 242 respectively couple the bitlines $BL_4$ and $BL_8$ to the main bitlines $MBL_b$ and $MBL_e$ which serve the entire semiconductor memory device. Hence, a pair of bitlines share a main bitline. That is, each main bitline is multiplexed onto two non-adjacent (diffused) bitlines within the memory block 200. With this embodiment, the number of main bitlines is one-half the number of (diffused) bitlines. Therefore, up to one-fourth of all the memory cells along the selected row can be simultaneously read or programmed.

Figure 3A:
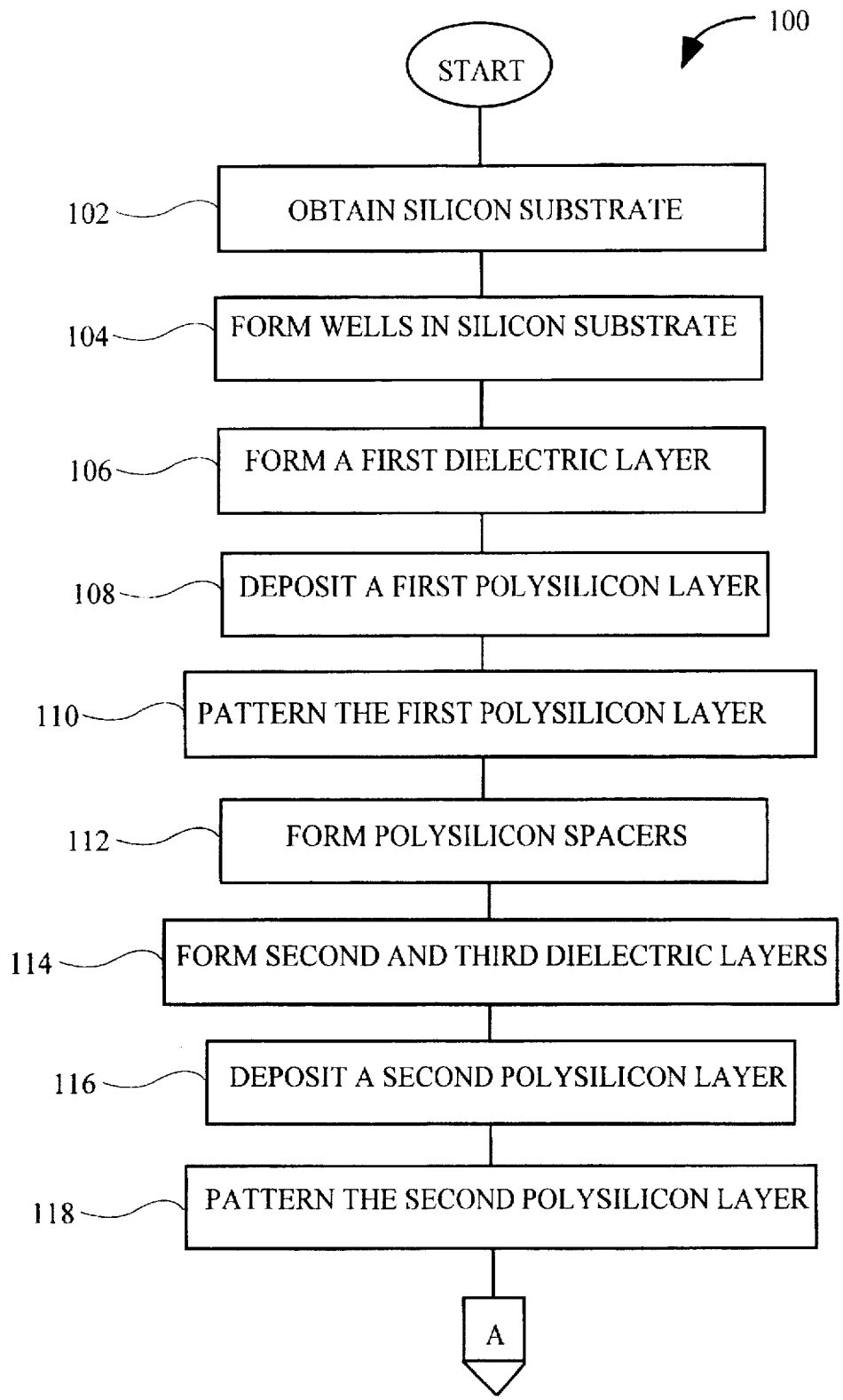
FIGS. 3A-3B are flow diagrams of a manufacturing process according to an embodiment of the invention.
Figure 3B:
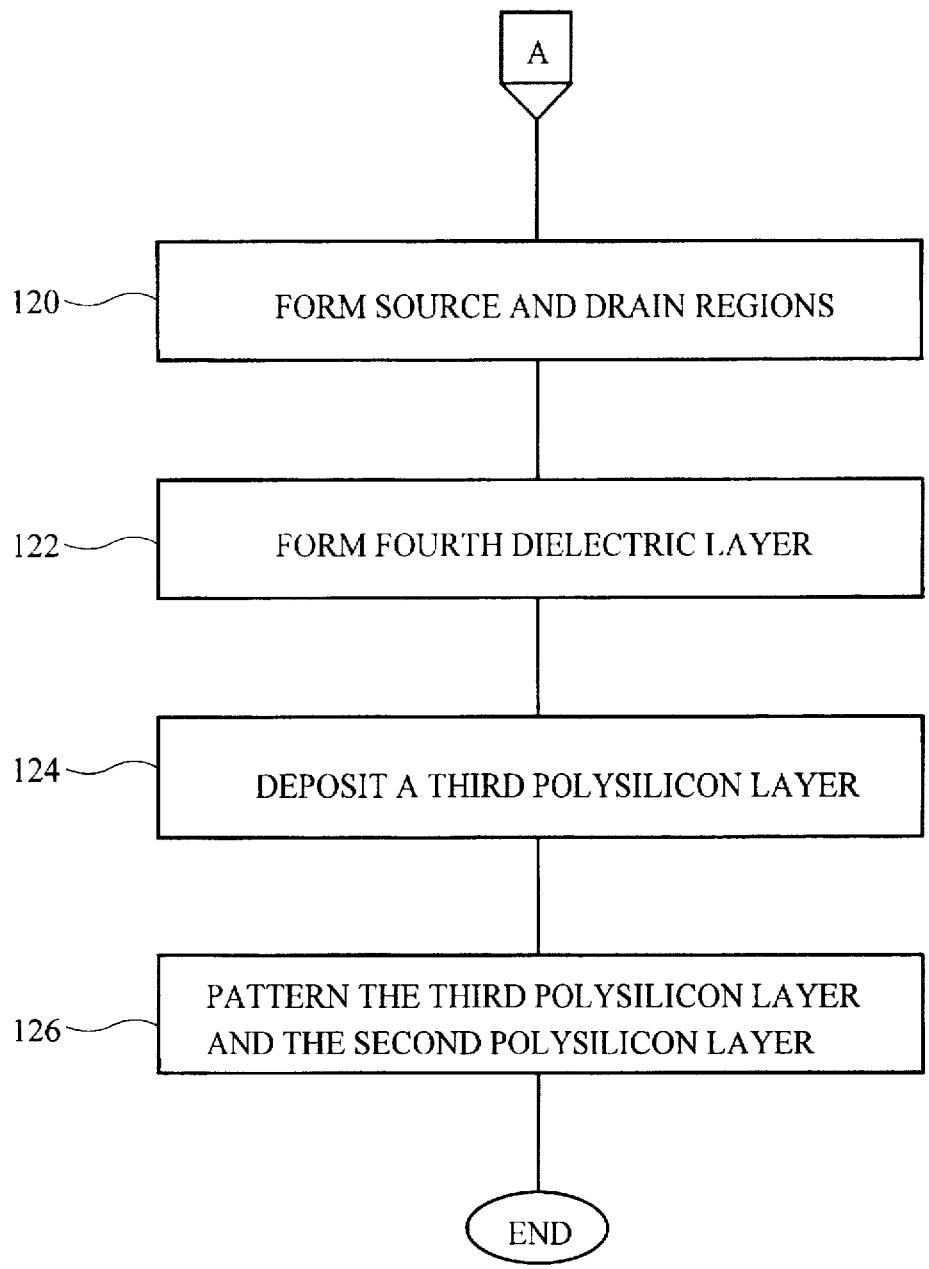

In some embodiments, the diffused bitlines are strapped in metal to reduce series resistance. However, with the embodiment illustrated in FIG. 8, the metal pitch for the main bitlines is reduced because two diffused bitlines share main (metal) bitline. The method or process for manufacturing the memory cells 2 for a semiconductor memory device is now described with reference to FIGS. 3A–3B, 4A–4F and 5A–5F. FIGS. 3A–3B are flow diagrams of a manufacturing process 100 according to an embodiment of the invention. FIGS. 4A–4F are diagrams of a cross section of a memory cell for a semiconductor memory device during various stages of fabrication. FIGS. 5A–5F are diagrams of a cross-section of a memory cell 2 for a semiconductor memory device during various stages of fabrication. The cross-section illustrated in FIGS. 5A–5F is the cross-section indicated by section indicators A and A' on FIG. 1 and is perpendicular to the cross-section illustrated in FIGS. 4A–4F.

Figure 4A:
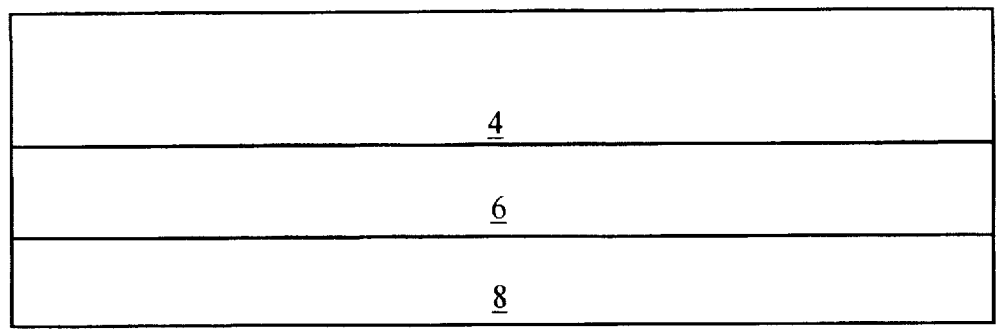
FIGS. 4A-4F are diagrams of a cross section of a memory cell for a semiconductor memory device at in a first direction during various stages of fabrication.
Figure 5A:
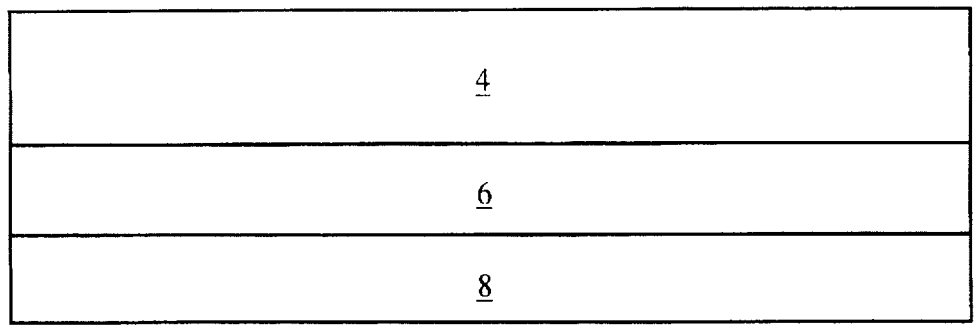
FIGS. 5A-5F are diagrams of a cross-section of a memory cell 2 for a semiconductor memory device in a second direction (that is perpendicular to the first direction) during various stages of fabrication.

FIGS. 4A and 5A are cross-sections of the memory cell 2 during an initial stage of fabrication. The initial stage of fabrication concerns forming wells 4 and 6 in the substrate to facilitate separate memory blocks on the main substrate 8. During the initial stage, a silicon substrate 8 having a first polarity is obtained (102). In an exemplary embodiment, the silicon substrate 8 can be silicon <100> and the first polarity can refer to P-type impurities. A block well 6 of a second polarity is implanted and diffused into the silicon substrate 8 (104). In the exemplary embodiment, the second polarity refers to N-type impurities and the thickness of the block well is between about 3–4 μm and phosphorus is implanted using an implant energy of about 45 keV to achieve an implant density of about $7 \, e \, 12$ ions/cm$^2$. Afterwards, a second well (referred to as the semiconductor substrate 4) of the first polarity is implanted and diffused into the block well 6 (104). In the exemplary embodiment, the thickness of the second well (semiconductor substrate 4) is about 1–1.5 μm and boron (B11) is implanted using an implant energy of about 50 keV to achieve an implant density of about $1.4 \, e \, 13$ ions/cm$^2$.

Figure 4B:
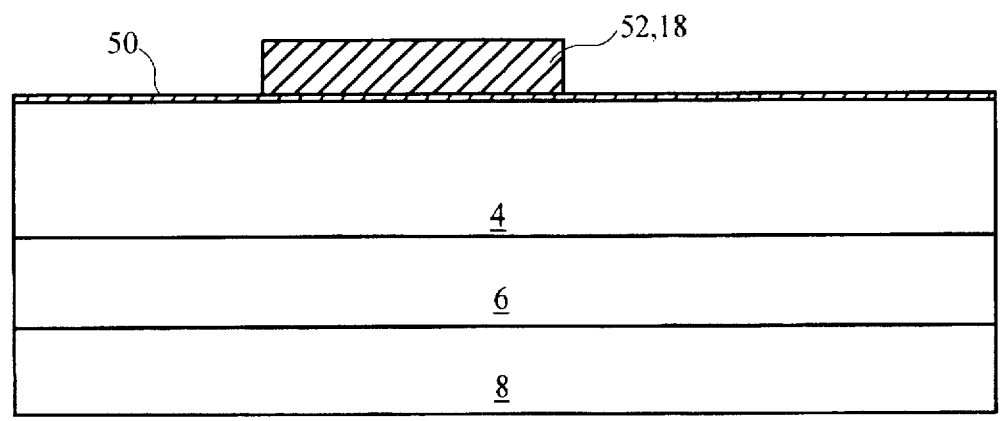
Figure 5B:
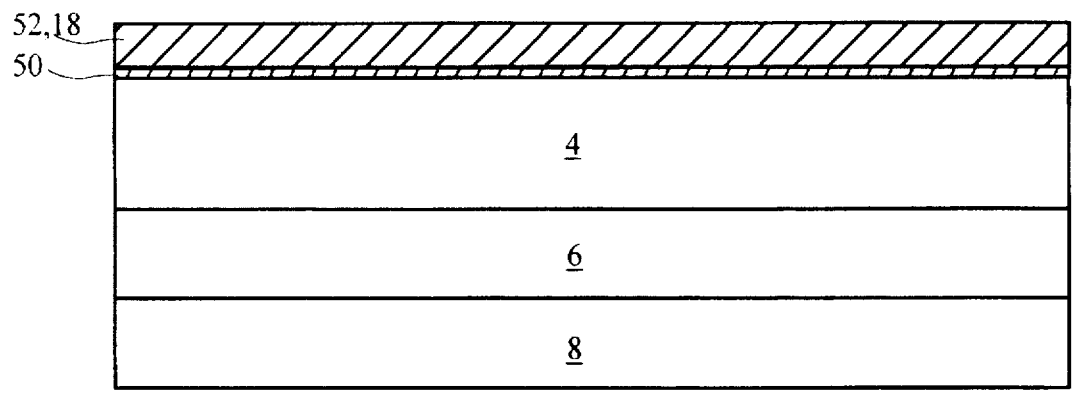

FIGS. 4B and 5B are cross-sections of the memory cell 2 during a first stage of fabrication. The first stage of fabrication concerns forming the select gate traces 34 over the semiconductor substrate 4. During the first stage, a first dielectric layer 50 having a thickness of about 100–300 angstroms (Å) is formed on the on the surface of the semiconductor substrate 4 (106). In the exemplary embodiment, the thickness of the first dielectric layer is about 200 Å. Then, a first polysilicon layer 52 is deposited over the first dielectric layer 50 (108). The first polysilicon layer 52 has a thickness of about 500–2500 Å and a doping concentration of about $1 \, e \, 20$ cm$^{-3}$. In the exemplary embodiment, the thickness of the first polysilicon layer 52 is about 1000 Å. Then, to form the select gate traces 34, the first polysilicon layer 52 is patterned using a photolithography and etching process as is well known in the art (110). In a slightly different implementation, an additional layer of dielectric (not shown) can be deposited immediately after the deposition of the first polysilicon layer and etched in the same step with the first polysilicon. This additional layer of dielectric would reduce the coupling between the floating gate 26 and the select gate 18, thereby providing for a high program margin. The thickness for this additional layer would, for example, be about 200–500 Å.

Figure 4C:
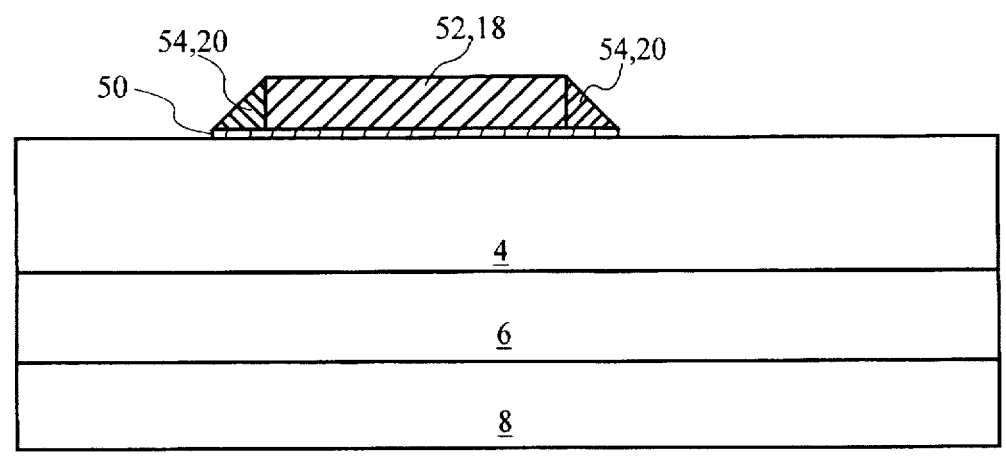
Figure 5C:
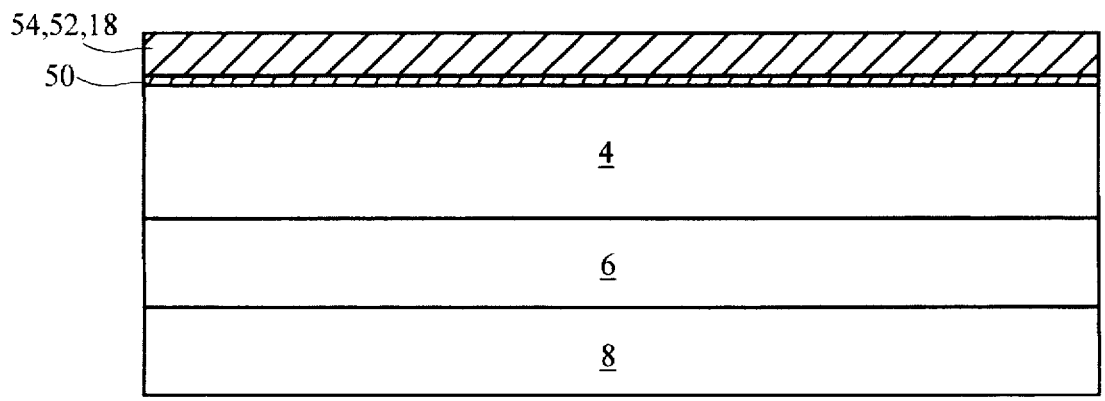

FIGS. 4C and 5C are cross-sections of the memory cell 2 during a second stage of fabrication. The second stage of fabrication concerns formation of polysilicon spacers 20 along the sides of the select gate traces 34 (112). These spacers 20 prevent formation of stringers by subsequent operations of the manufacturing process. Here, an additional polysilicon layer 54 is deposited, doped and etched back to form the polysilicon spacers 20 adjacent and electrically shorted to the select gate traces 34 formed by the first polysilicon layer 52. In the exemplary embodiment, a suitable plasma etching technique is used to form the polysilicon spacers 20. The additional polysilicon layer 54 has a thickness of about 500–2500 Å and a doping concentration of about $1 \, e \, 20$ cm$^{-3}$. In the exemplary embodiment, the thickness of the additional polysilicon layer 54 is about 1000

Å. Thereafter, the remaining portions of the first dielectric layer 50 that are not covered by polysilicon are removed using any suitable etching technique. By way of example, a suitable etching technique may include plasma etching.

Figure 4D:
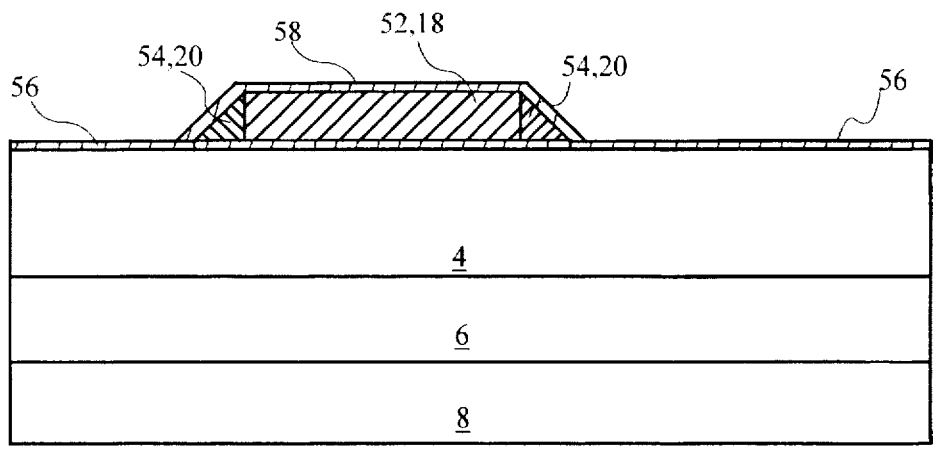
Figure 5D:
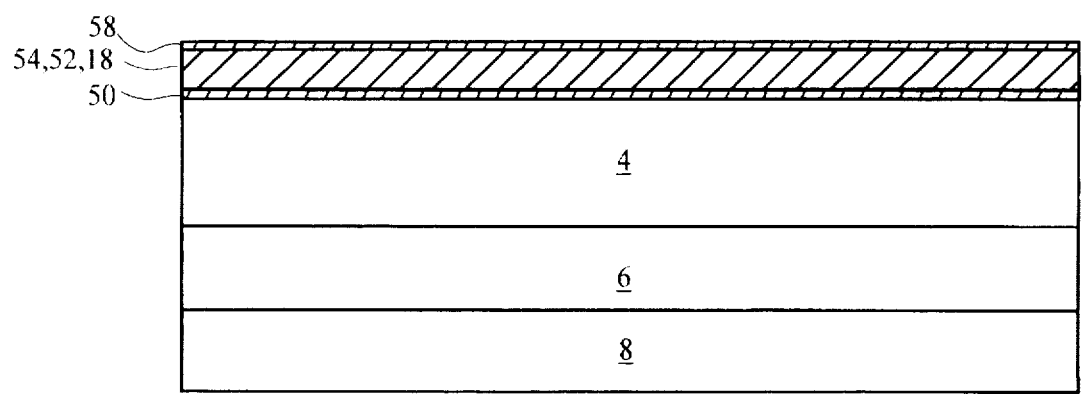

FIGS. 4D and 5D are cross-sections of the memory cell 2 during a third stage of fabrication. The third stage of fabrication concerns forming dielectric layers over the first polysilicon layer 52 and over exposed regions of the semiconductor substrate 4 (114). During the third stage, a second dielectric layer 56 having a thickness of between about 50–150 Å is formed on the exposed regions of the semiconductor substrate 4. In the exemplary embodiment, the thickness of the second dielectric layer is about 100 Å. At the same time, a third dielectric layer 58 having a thickness of between about 200–300 Å is formed on the remaining portion of the first polysilicon layer 52 (select gate traces 34) and the additional polysilicon layer 54 (the spacers 20). In the exemplary embodiment, the thickness of the third dielectric layer 58 is about 200 Å.

Figure 4E:
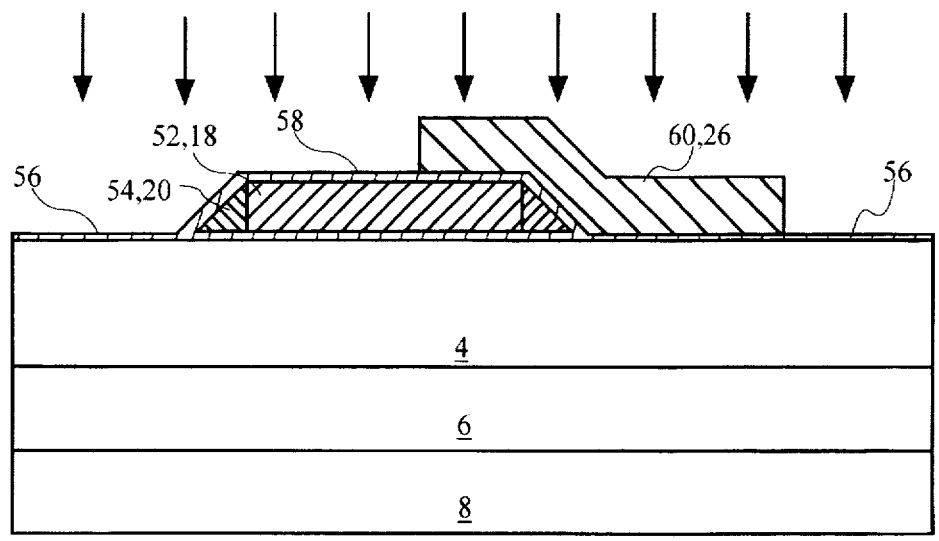
Figure 5E:
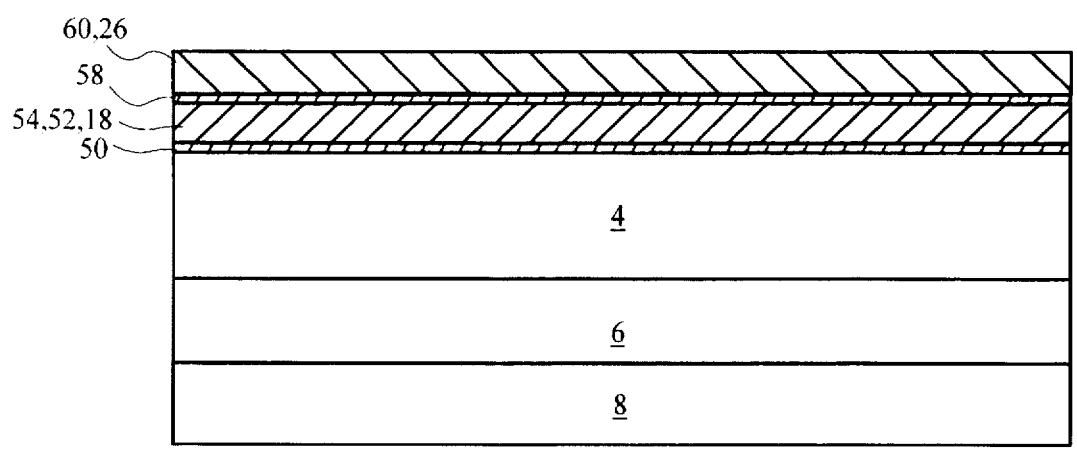

FIGS. 4E and 5E are cross-sections of the memory cell 2 during a fourth stage of fabrication. The fourth stage of fabrication concerns forming the floating gate traces 36 over a portion of the select gate traces 34 and over the semiconductor substrate 4. During the fourth stage, a second polysilicon layer 60 is deposited on the over the second and third dielectric layers 56, 58 (116). The second polysilicon layer 60 has a thickness of between about 500–2500 Å and a doping concentration of about 1 e 20 $cm^{-3}$. In the exemplary embodiment, the thickness of the second polysilicon layer 60 is about 1000 Å. Then, to form the floating gate traces 36, the second polysilicon layer 60 is patterned using a photolithography and etch process as is well known in the art (118). It should be noted that the second polysilicon layer 60 is patterned in the same direction as the first polysilicon layer 52 and partially covers the second dielectric layer 56 and third dielectric layer 58 after being patterned.

Figure 4F:
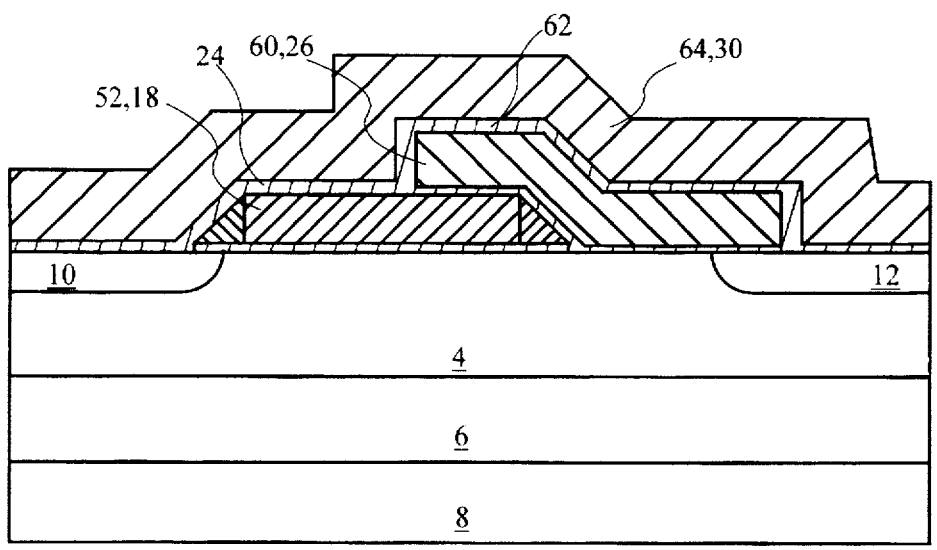
Figure 5F:
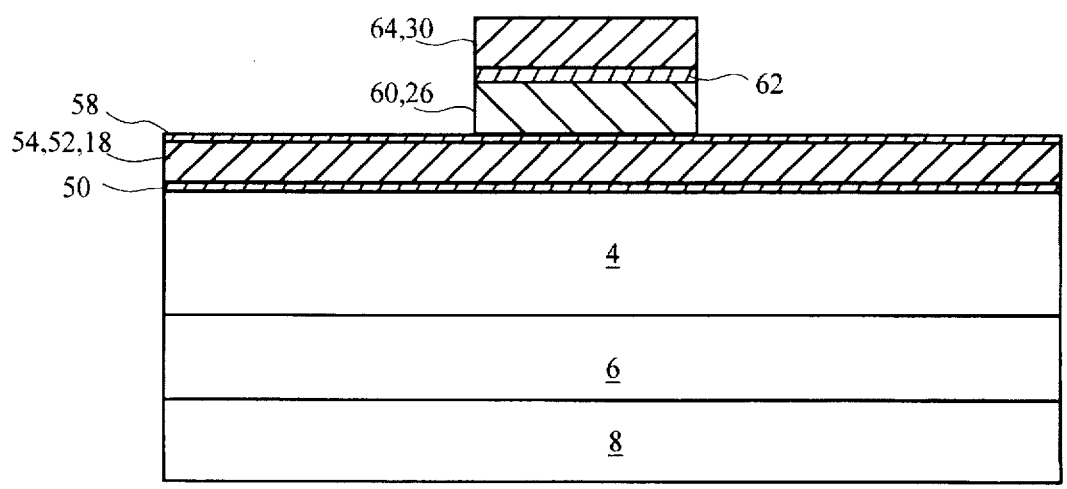

FIGS. 4F and 5F are cross-sections of the memory cell 2 during a fifth stage of fabrication. The fifth stage of fabrication concerns forming the source and drain regions 10 and 12, and the wordline traces 38. During the fifth stage, the source and drain regions 10 and 12 (bitlines) are then formed using any suitable ion implantation process (120). In the exemplary embodiment, arsenic (As) is implanted at using an implant energy of about 40 keV to achieve an implant density of about 4 e 15 ions/$cm^2$. The first and second polysilicon layers 54 and 60 form the mask for the ion implantation. Next, a fourth dielectric layer 62 having a thickness of about 100–300 Å is deposited. In the exemplary embodiment, the thickness of the fourth dielectric layer is about 170 Å. Thereafter, the third polysilicon layer 64 is deposited on the fourth dielectric layer 62 (124). The third polysilicon layer 64 has a thickness of about 500–2500 Å and a doping concentration of about 1 e 20 $cm^{-3}$. In the exemplary embodiment, the thickness of the third polysilicon layer 64 is about 1500 Å. Then, to form the wordline traces 38, the third polysilicon layer 64 is patterned (e.g., etched) using a photolithography and etch process as is well known in the art (126). At the same time, the second polysilicon layer 60 is again patterned to form the floating gates 26 from the floating gate traces 36 (126). By again patterning the second polysilicon layer 60 at this stage, the formation of the floating gates 26 are ensured to be self-aligned with the wordlines (control gates 30).

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A programmable and erasable non-volatile memory device having a plurality of memory cells, said device comprising:

a substrate having the memory cells formed thereon, said substrate having diffused source/drain regions parallel to one another in a first direction, and forming channel regions between adjacent pairs of the diffused source region and the diffused drain region;

select gate traces positioned over each of the channel regions, said select gate traces being parallel to one another in the first direction, each of said select gate traces being positioned over a first portion of the corresponding channel region, the first portion of the corresponding channel region being adjacent to the corresponding diffused source region and extending therefrom towards the corresponding diffused drain region;

floating gates for the memory cells, each of the memory cells including one of said floating gates, each of said floating gates being positioned over a second portion of the corresponding channel region, the second portion of the corresponding channel region being adjacent to the corresponding diffused drain region and extending therefrom towards the diffused source region; and wordline traces over each of said floating gates, each of said wordline traces being parallel to one another in a second direction, and each of said wordline traces being positioned over the corresponding floating gates and over a portion of the corresponding select gate traces.

2. A programmable and erasable non-volatile memory device as recited in claim 1, wherein said device further comprises:

a first dielectric layer positioned between said select gate traces and said substrate.

3. A programmable and erasable non-volatile memory device as recited in claim 2, wherein said device further comprises:

a second dielectric layer positioned between said floating gate and said substrate.

4. A programmable and erasable non-volatile memory device as recited in claim 3, wherein said wordline traces are over said floating gates and over at least a portion of said select gate traces, and wherein said device further comprises:

a third dielectric layer positioned between said select gate traces and said wordline traces.

5. A programmable and erasable non-volatile memory device as recited in claim 4, wherein said device further comprises:

a fourth dielectric layer positioned between said floating gates and said wordline traces.

6. A programmable and erasable non-volatile memory device as recited in claim 1, wherein said device operates in a program mode, a read mode and an erase mode, and wherein in the program mode the memory cells are programmed by source-side hot-electron injection, and in the erase mode the memory cells are erased by Fowler-Nordheim tunneling.

7. A programmable and erasable non-volatile memory device as recited in claim 6, wherein, to access the memory cells in the read mode or the program mode, one of said wordline traces is selected and alternative ones of said select gate traces are activated.

8. A programmable and erasable non-volatile memory device as recited in claim 7, wherein each of said wordline traces is associated with a row of the memory cells, and wherein in the read mode or the program mode up to one-half the memory cells in a selected row can be simultaneously read or programmed.

9. A programmable and erasable non-volatile memory device as recited in claim 8, wherein one of an odd or even parity is selected, then the alternating ones of said select gate traces are selected in accordance with the selected parity.

10. A programmable and erasable non-volatile memory device as recited in claim 8, wherein the grounding of the alternative ones of said select gate traces not being selected operates to suppress current flow in a reverse direction through the unselected memory cells along the selected wordline.

11. A programmable and erasable non-volatile memory device as recited in claim 1, wherein each of said wordline traces positioned over the corresponding floating gates in the second direction make up control gates for each of the corresponding floating gates in the second direction.

12. A programmable and erasable non-volatile memory device as recited in claim 1, wherein said device operates in a program mode, a read mode and an erase mode, wherein, to access the memory cells in the read mode or the program mode, one of said wordline traces is selected, and alternative ones of said select gate traces are raised to a positive voltage potential and those of the select gate traces not receiving the positive voltage potential are grounded.

13. A programmable and erasable memory device having a plurality of memory cells formed by individual transistors, each of said memory cells comprising:

a substrate having a diffused source region, a diffused drain region, and a channel region between the diffused source region and the diffused drain region;

a select gate positioned adjacent to the channel region, said select gate being positioned over a first portion of the channel region, the first portion being adjacent to the diffused source region and extending therefrom towards the diffused drain region;

a floating gate adjacent to the channel region, said floating gate being positioned over a second portion of the channel region, the second portion being adjacent to said diffused drain region and extending therefrom towards the diffused source region; and a control gate over said floating gate and over at least a portion of said select gate.

14. A programmable and erasable memory device as recited in claim 13, wherein said floating gate is also positioned over a portion of said select gate closest to the diffused drain region.

15. A programmable and erasable memory device as recited in claim 13, wherein each of said memory cells further comprises:

a first dielectric layer between said select gate and said substrate; and a second dielectric layer between said floating gate and said substrate.

16. A programmable and erasable memory device as recited in claim 13, wherein said floating gate is also positioned over a portion of said select gate, and wherein each of said memory cells further comprises:

a first dielectric layer between said select gate and said substrate;

a second dielectric layer between said floating gate and said substrate;

a third dielectric layer between said floating gate and said select gate; and a fourth dielectric layer between said control gate and said floating gate.

17. A programmable and erasable non-volatile memory device as recited in claim 1, wherein said select gate traces are entirely positioned over the channel regions.

18. A programmable and erasable non-volatile memory device as recited in claim 1, wherein said select gate traces are adjacent to and over the channel regions and are not formed over said floating gates or said wordlines.

19. A programmable and erasable non-volatile memory device as recited in claim 1, wherein said select gate traces include spacers alone the sides of said select gate traces in the first direction.

20. A programmable and erasable non-volatile memory device having a plurality of memory cells, said device comprising:

a substrate having the memory cells formed thereon, said substrate having diffused source/drain regions parallel to one another in a first direction, and forming channel regions between adjacent pairs of the diffused source region and the diffused drain region;

select gate traces positioned over each of the channel regions, said select gate traces being parallel to one another in the first direction, each of said select gate traces being positioned over a first portion of the corresponding channel region, the first portion of the corresponding channel region being adjacent to the corresponding diffused source region and extending therefrom towards the corresponding diffused drain region;

floating gates for the memory cells, each of the memory cells including one of said floating gates, each of said floating gates being positioned over a second portion of the corresponding channel region, the second portion of the corresponding channel region being adjacent to the corresponding diffused drain region and extending therefrom towards the diffused source region, each of said floating gates also being positioned over a portion of said select gate traces closest to the diffused drain region; and wordline traces over each of said floating gates, each of said wordline traces being parallel to one another in a second direction, and each of said wordline traces being positioned over the corresponding floating-gates in the second direction.

21. A programmable and erasable non-volatile memory device as recited in claim 20, wherein said select gate traces are adjacent to and over the channel regions and are not formed over said floating gates or said wordlines.

22. A programmable and erasable non-volatile memory device as recited in claim 20, wherein said select gate traces include spacers alone the sides of said select gate traces in the first direction.

23. A programmable and erasable non-volatile memory device as recited in claim 20, wherein said wordline traces are positioned over said floating gates and said select gate traces.

24. A programmable and erasable non-volatile memory device as recited in claim 23,
   wherein said select gate traces are adjacent to and over the channel regions and are not formed over said floating gates or said wordlines, and
   wherein said select gate traces include spacers alone the sides of said select gate traces in the first direction.

25. A programmable and erasable memory device as recited in claim 13, wherein said select gate is entirely positioned over the channel region.

26. A programmable and erasable memory device as recited in claim 13, wherein said select gate is adjacent to and over the channel region and are not formed over said floating gate or said control gate.

27. A programmable and erasable memory device as recited in claim 13, wherein said select gate include spacers alone the sides of said select gate.

28. A programmable and erasable memory device having a plurality of memory cells formed by individual transistors, each of said memory cells comprising:
   a substrate having a diffused source region, a diffused drain region, and a channel region between the diffused source region and the diffused drain region;
   a select gate positioned adjacent to the channel region, said select gate being positioned over a first portion of the channel region, the first portion being adjacent to the diffused source region and extending therefrom towards the diffused drain region;
   a floating gate adjacent to the channel region, said floating gate being positioned over a second portion of the channel region, the second portion being adjacent to said diffused drain region and extending therefrom towards the diffused source region, and said floating gate being positioned over a portion of said select gate closest to the diffused drain region; and
   a control gate over said floating gate,
   wherein said select gate is adjacent to and over the channel regions and not formed over said floating gate or said control gate.

29. A programmable and erasable memory device as recited in claim 28, wherein said select gate includes spacers alone the sides of said select gate.

30. A programmable and erasable memory device as recited in claim 28, wherein said control gate is positioned over said floating gate and said select gate.

31. A programmable and erasable memory device as recited in claim 30, wherein said select gate includes spacers alone the sides of said select gate.

* * * * *